United States Patent [19]

Kofler

[11] Patent Number: 5,299,727
[45] Date of Patent: Apr. 5, 1994

[54] METHOD OF MANUFACTURE OF AN OPTOELECTRONIC COUPLING ELEMENT

[75] Inventor: Albin Kofler, Burgkirchen, Austria

[73] Assignee: Temic Telefunken microelectronic GmbH, Heilbronn, Fed. Rep. of Germany

[21] Appl. No.: 45,665

[22] Filed: Apr. 9, 1993

[30] Foreign Application Priority Data

May 5, 1992 [DE] Fed. Rep. of Germany ....... 4214792

[51] Int. Cl.$^5$ ............................................ H01L 21/60
[52] U.S. Cl. ........................................ 228/177; 29/868
[58] Field of Search ....................... 228/177, 179, 248; 250/227.24; 385/53; 156/325; 29/868

[56] References Cited

U.S. PATENT DOCUMENTS

| | | | |
|---|---|---|---|
| 3,878,397 | 4/1975 | Robb et al. | 250/551 |
| 4,863,232 | 9/1989 | Kwa | 385/89 |
| 4,890,894 | 1/1990 | Kwa | 385/56 |

FOREIGN PATENT DOCUMENTS

| | | |
|---|---|---|
| 0127401 | 12/1984 | European Pat. Off. |
| 0347704 | 12/1989 | European Pat. Off. |
| 1614880 | 12/1970 | Fed. Rep. of Germany |
| 3211792 | 11/1983 | Fed. Rep. of Germany |
| 226431 | 8/1985 | Fed. Rep. of Germany |
| 3630382A1 | 3/1988 | Fed. Rep. of Germany |
| 86/01458 | 3/1986 | PCT Int'l Appl. |

OTHER PUBLICATIONS

Patent Abstracts of Japan; vol. 6, No. 67 (E-104)(945), Apr. 28th, 1982 & JP-A-57 007 170 (Nitsushin), Jan. 14th, 1982.

Motorola Inc., Technical Developments, vol. 14, Dec. 1991, V. J. Adams "Pre Assembled Opto . . . ".

*Primary Examiner*—Samuel M. Heinrich
*Attorney, Agent, or Firm*—Spencer, Frank & Schneider

[57] ABSTRACT

The invention relates to a method for manufacture of an optoelectronic coupling element having a multi-part housing, in which a first housing section is designed as a plug and a second housing section as the receptacle receiving said plug, and where at least one optoelectronic element each is mounted on a contact strip in said first and second housing sections. The method in accordance with the invention is characterized in that the first and second housing sections are initially shaped around one contact strip segment each, in that in a further process step the optoelectronic elements are mounted in cutouts in the interiors of the plug and the receptacle, and in that the plug and the receptacle are joined together after manufacture of the electrical connections of the optoelectronic elements with their respective contact strips.

11 Claims, 2 Drawing Sheets

5,299,727

METHOD OF MANUFACTURE OF AN OPTOELECTRONIC COUPLING ELEMENT

BACKGROUND OF THE INVENTION

The invention relates to a method for manufacture of an optoelectronic coupling element.

Designing the housing of one element with an integrated hollow cylinder as a receptacle and the housing of the second element as a plug, and inserting the plug directly into the receptacle in order to optically connect two optoelectronic elements, is known from German patent DE 36 30 382 A1. Furthermore, providing the element designed as a plug with a housing of a commercially available LED is also known from this publication. The housing shape of the element provided as the receptacle is known from optoelectronic elements used for coupling and uncoupling of an optical signal in an optical waveguide. To increase the optical coupling factor, at least one of the two elements is provided with a lens. The two housing sections are manufactured using standard methods, such as casting, pressing and injection molding, as known from LED production.

Since the optoelectronic elements are accommodated in complete housings and are surrounded on all sides by the housing material, these housings are best comprised of transparent, light-permeable material. This results in a not inconsiderable emission of the luminous power from the transmitter to the outside. Added to the problem of insufficient coupling is that of extraneous light incidence from the outside, which further reduces the quality of an optocoupler of this type. To make the housing optically tight, a second outer housing is provided that completely surrounds the first housing. However, these measures necessitate a number of additional production steps.

SUMMARY OF THE INVENTION

The object underlying the invention is to provide a method for manufacture of an optoelectronic coupling element where the housing comprises two sections that can be fitted together and which each hold at least one optoelectronic semiconductor element, with one section being designed as a plug and the other as a receptacle, avoiding the aforementioned drawbacks.

In an advantageous embodiment of the method, the two contact strips are embedded in a plastic in a first process step. One strip is designed as a plug and a second strip as a receptacle. The plug and the receptacle have cutouts to hold the optoelectronic elements. In these cutouts, the contact strips are exposed such that the optoelectronic semiconductor elements can be electrically connected. After contacting of the semiconductor elements by affixing them to the contact strips using a conductive adhesive or by connecting them using bond wires, the housing sections are joined together in a concluding process step. The connection of the housing sections is then fixed. This can be achieved with the aid of a grid in the plug connection, while another embodiment of the method provides for glueing or welding of the housing.

In a further advantageous embodiment of the invention, the optoelectronic semiconductor elements are each provided with a drop of resin before the housing sections are joined together. When the housing sections are joined up, the resin drops of the opposite elements mingle and thus provide the optical connection. At the same time, the housing sections are fixed. In an advantageous embodiment of the method, the housing sections are manufactured in a block-shaped basic form. This permits the finished elements to be processed by automatic PCB component insertion facilities.

One particular advantage of the method in accordance with the invention is that the optoelectronic semiconductor elements are not embedded in the plastic of the housing sections, but are mounted on prefabricated housing sections. It is therefore possible to select any transparent, opaque or light-impermeable plastics for the housing material. In the normal case, a light-impermeable plastic will be selected, so that the housing is optically tight. The resin drop between the semiconductor elements increases on the one hand the optical coupling factor and on the other hand the electrical high-voltage resistance of the element produced in accordance with the invention.

BRIEF DESCRIPTION OF THE DRAWINGS

The invention is described in detail in the following on the basis of the figures.

In the figures.

DESCRIPTION OF THE PREFERRED EMBODIMENT

Figure 1:
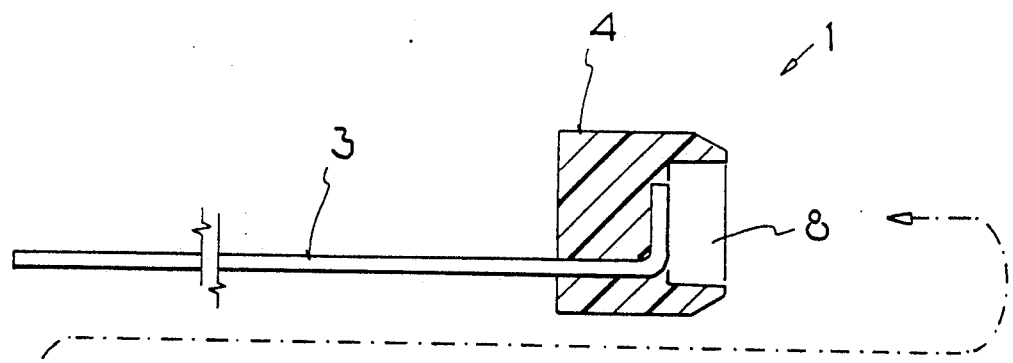
FIG. 1 shows contact strips surrounded by plastic in one stage of the method.

FIG. 1 shows the two housing sections 1, 2 of the optoelectronic coupling element in a first stage of the manufacturing process in accordance with the invention. The contact strips 3 comprise a row of connection lugs having a common carrier strip. The connection lugs are divided up into groups that are surrounded with plastic 4 to form a housing section 1, 2.

Plug 1 and receptacle 2 therefore each have 4 connection lugs in this embodiment, so that a total of 8 lugs are available in the finished optoelectronic coupling element. The number of connection lugs is only predetermined by the number of electrical feed lines required by the elements 5, 6, and is otherwise freely selectable. This means that it is quite possible to fit several elements in each housing section. These groups of connection lugs, hereafter referred to in brief as contact strips 3, are surrounded by a plastic molded piece 4 in a first process step using known techniques, for example injection molding. These plastic molded pieces 4 are designed as a plug 1 for one part and as a receptacle 2 for the other part of the contact strip. The plastic molded piece 4 of the plug 1 can be inserted into the matching receptacle 2 for a positive connection. The exact shapes of plug 1 and receptacle 2 depend on the required housing shape of the optoelectronic coupler and can be adjusted to that shape by design measures. The insides of the plug and the receptacle each have a cutout 8. Parts of the contact strips 3 are exposed in these cutouts 8. In the embodiment, the ends of the contact strip 3 that are enclosed by the plastic molded piece are angled. The angled longitudinal side of the contact strip 3 is exposed on the bottom of the cutout 8. In the assembled state, the bottoms of the cutouts 8 of plug 1 and receptacle 2 are opposite to one another.

Figure 2:
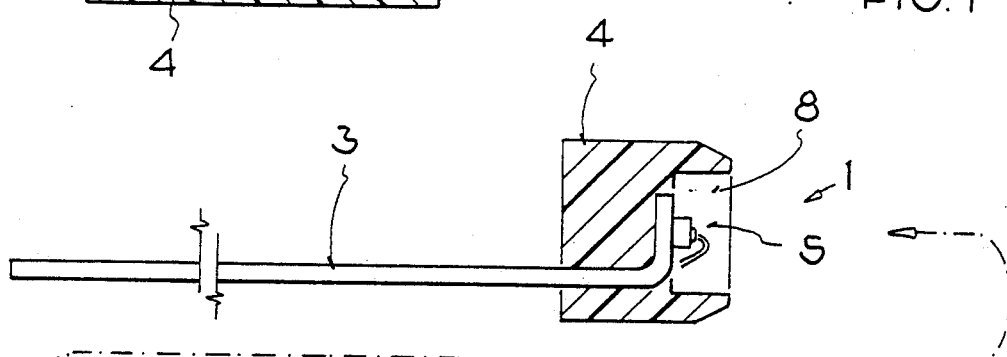
FIG. 2 shows contact strips with attached element in a further stage of the method.
Figure 2:
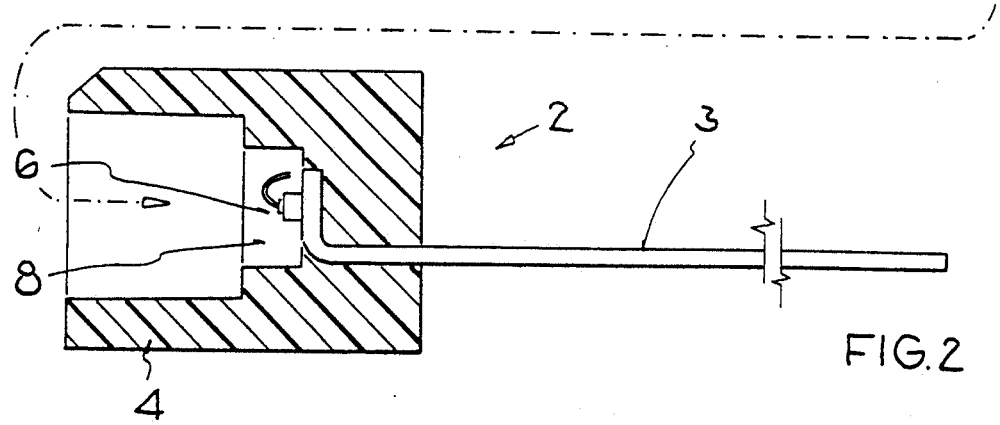

FIG. 2 shows the two housing sections 1, 2 of the optoelectronic coupling element in a second stage of the manufacturing method in accordance with the invention. Here, the optoelectronic elements 5, 6 are fitted in the cutouts 8 of plug 1 and receptacle 2. Assembly is performed in this embodiment with the aid of the conductive adhesive such that the rear contact of the element 5, 6 is electrically connected to a connecting lug of the contact strip 3. In another embodiment, the element 5, 6 is soldered to the angled end of the connecting lug, with an electrical contact to the rear electrode of the element 5, 6 being made at the same time. Other assembly techniques, for example glueing to the plastic molded piece 4 in the cutout 8, can also be applied. The remaining electrical connections are made from the exposed surface of the optoelectronic element by connecting lines to the connecting lugs provided for that purpose on the contact strip 3. This can be achieved using known wire bond processes, for example.

After the elements 5, 6 have been fitted in the cutouts 8 of plug 1 and receptacle 2, and the necessary electrical connections have been made, the cutouts 8 of plug 1 and receptacle 2 are filled with a resin droplet in this embodiment. When the plug 1 and receptacle 2 are subsequently joined, the two resin drops mingle and thereby ensure an improved optical coupling of the elements.

Figure 3:
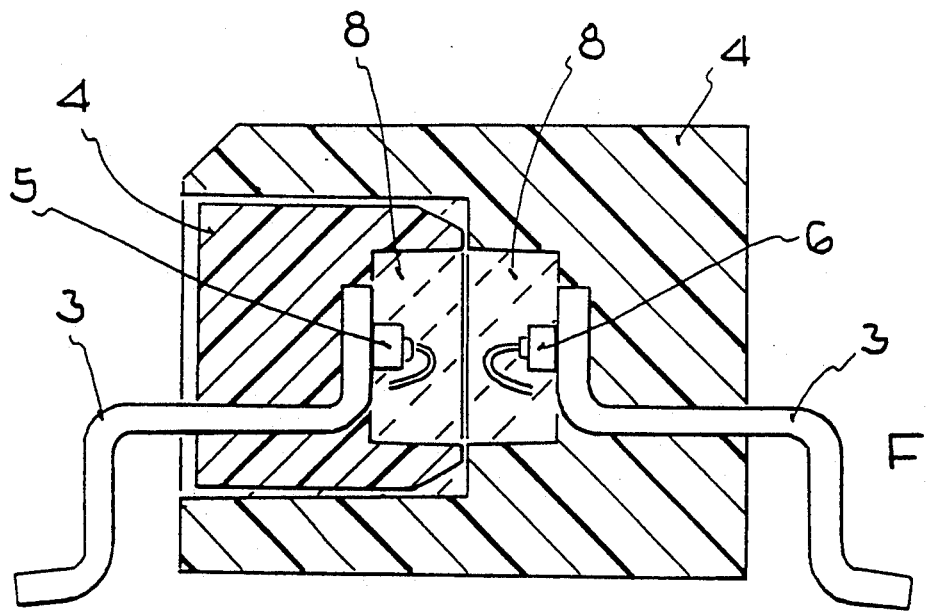
FIG. 3 shows a section through the optoelectronic coupling element in a side view.
Figure 4:
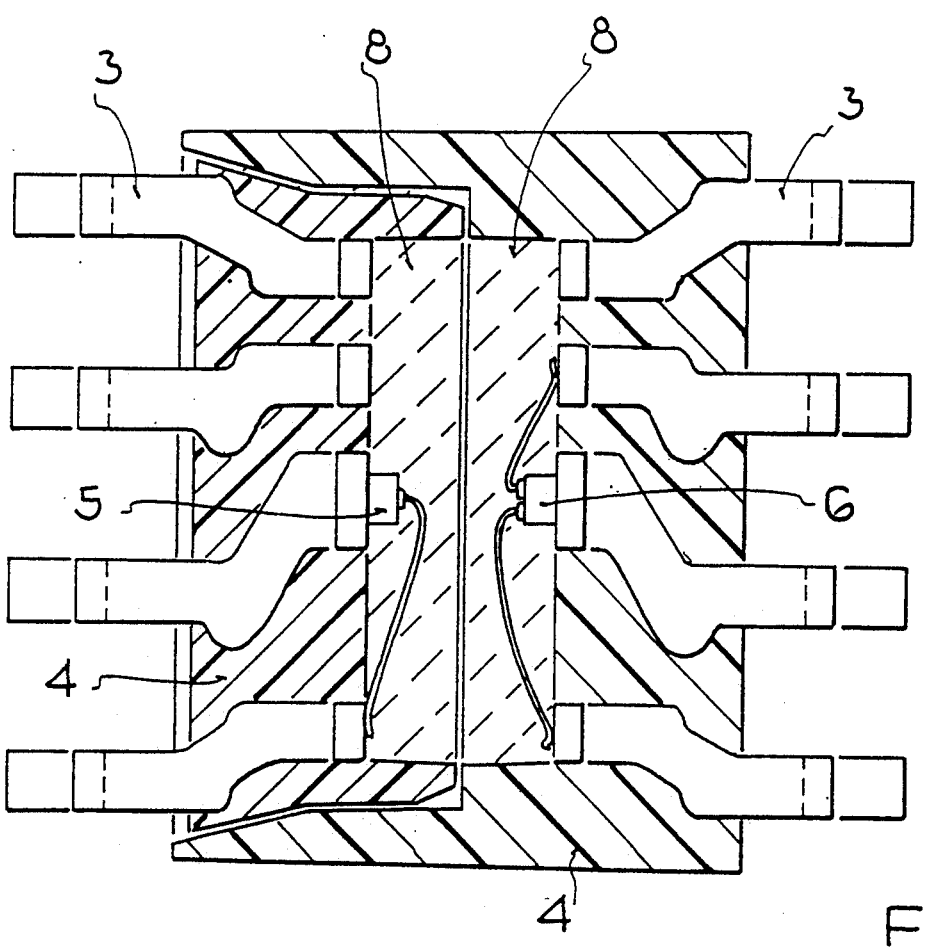
FIG. 4 shows a section through the optoelectronic coupling element in a plan view.

FIGS. 3 and 4 show sections through an optoelectronic coupling element made using the method in accordance with the invention, in a side view and a plan view. The two optoelectronic elements 5, 6 are disposed in the cutouts 8 of plug 1 and receptacle 2 such that the elements 5, 6 are substantially opposite to one another. The connection of plug 1 and receptacle 2 is fixed by welding of the two housing sections 1, 2 in this embodiment. A further embodiment of the method achieves fixing of the connection of plug and receptacle by glueing together the two housing sections. In a further embodiment, additional fixing is achieved by design measures in plug 1 and receptacle 2. An engaging mechanism secures the connection of the two housing sections 1, 2, either by itself or additionally to the measures already described above.

To achieve a better optical coupling between the elements, the inner area formed by the cutouts 8 is provided with a reflection layer in a further embodiment of the method in accordance with the invention, which reflects the optical radiation. In a further embodiment of the invention, the plastic material 4 of the housing sections 1, 2 is selected such that a reflecting surface is obtained in the inner area formed by the cutouts 8.

The particular advantage of the method in accordance with the invention is that—unlike with known methods for manufacture of optoelectronic coupling elements—the optoelectronic elements are fitted in prefabricated housing sections and the housing sections are then only joined together. A molding process can be dispensed with here, since the plastic housing sections can be made using known injection molding techniques, for example. The method in accordance with the invention is therefore less expensive and simpler than known methods for the manufacture of optoelectronic coupling elements.

What is claimed is:

1. A method for manufacture of an optoelectronic coupling element having a multi-part housing, with a first housing section (1) being designed as a plug and a second housing section (2) as the receptacle receiving said plug, and with at least one optoelectronic element (5, 6) each being mounted on a contact strip (3) in said first and second housing sections, wherein said first and second housing sections (1, 2) are initially shaped around one contact strip (3) each, wherein in a further process step said optoelectronic elements (5, 6) are mounted in cutouts (8) in the insides of said plug (1) and said receptacle (2), and wherein said plug (1) and said receptacle (2) are joined together after manufacture of the electrical connections of said optoelectronic elements using their respective contact strips (3).

2. A method according to claim 1, wherein the assembly of said optoelectronic elements (5, 6) is achieved by soldering them to the exposed connections of said contact strips (3).

3. A method according to claim 1, wherein the assembly of said optoelectronic elements (5, 6) is achieved by affixing them to the exposed connections of said contact strips (3) using conductive adhesive.

4. A method according to claim 2, wherein the electrical connection between said optoelectronic elements (5, 6) and the connections of said contact strips (3) is made using wire bonds.

5. A method according to claim 2, wherein rear contacts of said optoelectronic elements (5, 6) are connected electrically to said contact strips (3) by mounting them on the connections of said contact strips.

6. A method according to claim 1, wherein the volume created by the joining together of said plug (1) and said receptacle (2) and enclosed by said cutouts (8) is filled with a resin.

7. A method according to claim 1, wherein the connection of said two housing sections (1, 2) is fixed using an adhesive.

8. A method according to claim 1, wherein the connection of said two housing sections (1, 2) is fixed by the provision of engaging catches.

9. A method according to claim 1, wherein said cutouts (8) of said two housing sections (1, 2) are provided with a reflection layer.

10. A method according to claim 1, wherein said optoelectronic elements (5, 6) are assembled such that they are substantially opposite to one another.

11. A method according to claim 3, wherein the electrical connection between said optoelectronic elements (5, 6) and the connections of said contact strips (3) is made using wire bonds.

* * * * *